(12) United States Patent
Tashibu et al.

(10) Patent No.: US 7,897,996 B2
(45) Date of Patent: Mar. 1, 2011

(54) SEMICONDUCTOR DEVICE AND METHOD FOR MANUFACTURING THE SAME

(75) Inventors: Masakazu Tashibu, Yokohama (JP); Katsu Honna, Kitakyushu (JP); Atsushi Jinnai, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 166 days.

(21) Appl. No.: 12/349,174

(22) Filed: Jan. 6, 2009

(65) Prior Publication Data

US 2009/0184339 A1 Jul. 23, 2009

(30) Foreign Application Priority Data

Jan. 8, 2008 (JP) ............... 2008-001098

(51) Int. Cl.
*H01L 29/739* (2006.01)
(52) U.S. Cl. ............... 257/139; 257/E21.546; 257/E29.197; 438/424
(58) Field of Classification Search ........... 257/139, 257/510, E21.546, E29.197, E29.02; 438/424
See application file for complete search history.

(56) References Cited

U.S. PATENT DOCUMENTS 4,225,878 A * 9/1980 Dobkin ............. 257/530

2006/0172466 A1 * 8/2006 Shiba ............... 438/124

FOREIGN PATENT DOCUMENTS

JP 08-055961 2/1996

* cited by examiner

*Primary Examiner*—Thomas L Dickey
*Assistant Examiner*—Fazli Erdem
(74) *Attorney, Agent, or Firm*—Turocy & Watson, LLP

(57) ABSTRACT

A semiconductor device includes: an insulating film provided on a back surface of a semiconductor substrate; a plurality of isolation regions provided to reach the insulating film from a main surface of the semiconductor substrate; at least a first semiconductor layer and a second semiconductor layer which are electrically insulated from each other by the isolation regions in the semiconductor substrate; a first voltage applied terminal electrically connected to a front surface of the first semiconductor layer; a second voltage applied terminal electrically connected to a front surface of the second semiconductor layer; a selector circuit receiving voltages from the first voltage applied terminal and the second voltage applied terminal, and supplying an output in accordance with a combination of the voltages; and a conductive layer provided so as to contact with the insulating film provided to the back side of the semiconductor substrate.

20 Claims, 4 Drawing Sheets

SEMICONDUCTOR DEVICE AND METHOD FOR MANUFACTURING THE SAME

CROSS REFERENCE TO RELATED APPLICATIONS

This application is based upon and claims the benefit of priority from the prior Japanese Patent Application No. 2008-1098, filed on Jan. 8, 2008, the entire contents of which are incorporated herein by reference.

BACKGROUND OF THE INVENTION

1. Field of the Invention

The present invention relates to a semiconductor device and method for manufacturing the same.

2. Related Art

After a semiconductor wafer is produced or a semiconductor chip is fabricated, a test is conducted and, for example, a failure element is replaced with a redundant circuit and voltage values are switched to obtain a power supply voltage with a desired accuracy level, which is called trimming.

Related-art technologies employ zener zaps, which are devices required for trimming purposes. A power supply voltage is applied in advance to two input terminals of a selector circuit, and a zener zap is coupled in series between a ground terminal and each of the input terminals. One of the zener zaps with this state is selectively applied with large current, whereby heat is generated to break down the device to be short-circuited to the ground terminal. A combination of voltages input to the selector circuit is thus determined.

Such zener zaps, however, occupy some area on the wafer exclusively for trimming purposes, which inevitably increases the circuit area. This configuration also requires isolation of the zener zaps, into which large current is flown, to avoid any impact on other circuit elements. As a consequence, area efficiency remains low.

Another concern is residual resistance remaining after the breakdown of the zener zap. Further, the short-circuited state after the breakdown cannot be maintained stably, possibly resulting in an increase in resistance values or complete fracture to cause an open state.

The document mentioned below discloses a trimming technology without the use of zener zaps.

Japanese Patent Application Publication No. 8-055961 describes a technology used for a structure having a resistor provided on a surface of a semiconductor substrate, a thick insulating film provided above the resistor, a contact hole coupled to the resistor through the insulating film, a thin insulating film provided on the surface of the resistor in the contact hole, and metal wiring coupled to the contact hole. By the technology, the thin insulating film is applied with a voltage and broken down, whereby the resistor and the metal wiring are short-circuited to adjust resistance values.

The technology described in Japanese Patent Application Publication No. 8-055961, however, requires an additional step to provide an insulating film having a thickness small enough to be broken down by a lower voltage compared with the voltage required for breaking down the zener zap. This increases manufacturing steps and cost.

Furthermore, a diffusion layer serving as a resistor is also applied with the voltage for breaking down the insulating film, which may adversely affect resistance values of the diffusion layer after the breakdown of the insulating film.

SUMMARY OF THE INVENTION

A semiconductor device according to an embodiment of the present invention comprises: an insulating film provided on a back surface of a semiconductor substrate; a plurality of isolation regions provided to reach the insulating film from a main surface of the semiconductor substrate; at least a first semiconductor layer and a second semiconductor layer which are electrically insulated from each other by the isolation regions in the semiconductor substrate; a first voltage applied terminal electrically connected to a front surface of the first semiconductor layer; a second voltage applied terminal electrically connected to a front surface of the second semiconductor layer; a selector circuit receiving voltages from the first voltage applied terminal and the second voltage applied terminal, and supplying an output in accordance with a combination of the voltages; and a conductive layer provided so as to contact with the insulating film provided to the back side of the semiconductor substrate.

A semiconductor device according to an embodiment of the present invention comprises: an insulating film provided on a back surface of a semiconductor substrate; a plurality of isolation regions provided to reach the insulating film from a main surface of the semiconductor substrate; at least a first semiconductor layer and a second semiconductor layer which are electrically insulated from each other by the isolation regions in the semiconductor substrate; a first voltage applied terminal electrically connected to a front surface of the first semiconductor layer; a second voltage applied terminal electrically connected to a front surface of the second semiconductor layer; a first switch connected in series between the first voltage applied terminal and a first node which is applicable with a predetermined voltage; a second switch connected in series between the second voltage applied terminal and a second node which is applicable with the predetermined voltage; a selector circuit receiving voltages from the first voltage applied terminal and the second voltage applied terminal, and supplying an output in accordance with a combination of the voltages; a power supply circuit connected to the first node and the second node and applying a predetermined voltage, respectively; and a conductive layer provided so as to contact with the insulating film provided to the back side of the semiconductor substrate.

A method for manufacturing a semiconductor device according to an embodiment of the present invention comprises:, the method comprises:

forming a plurality of deep trench isolations on a main surface of a semiconductor substrate by embedding an insulating material in deep trenches;

providing, on the semiconductor substrate, a first voltage applied terminal electrically connected to a front surface of a first semiconductor layer provided between two of the deep trench isolations which are adjacent to each other, a second voltage applied terminal electrically connected to a front surface of a second semiconductor layer provided between other two of the deep trench isolations which are adjacent to each other, and a selector circuit which receives voltages from the first voltage applied terminal and the second voltage applied terminal and supplies an output in accordance with a combination of the voltages;

polishing a back surface of the semiconductor substrate until the plurality of deep trench isolations are exposed on the back surface of the semiconductor substrate;

providing an insulating film on the back surface of the semiconductor substrate; and providing a conductive layer under the insulating film.

DETAILED DESCRIPTION OF THE INVENTION

Figure 1:
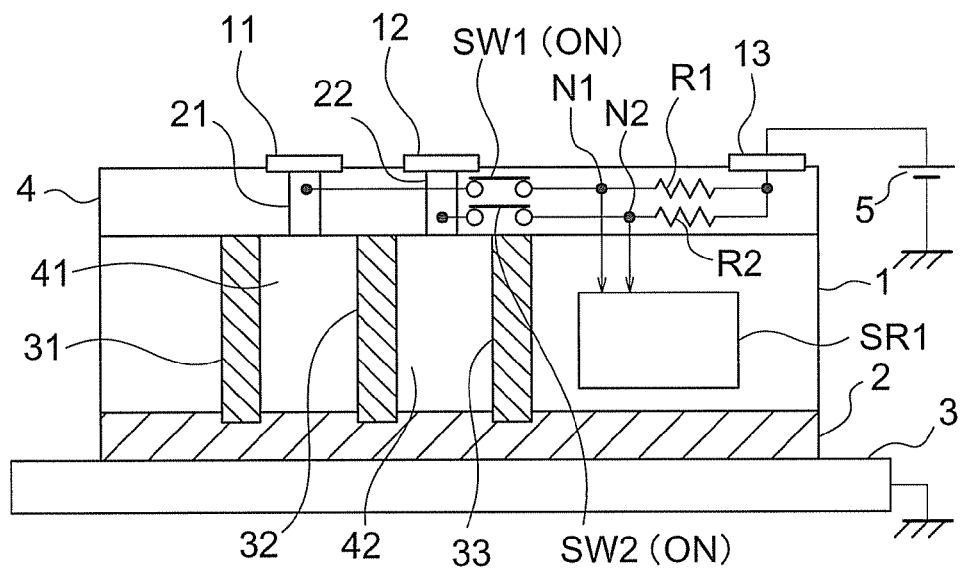
FIG. 1 is a sectional view of the semiconductor device before trimming according to an embodiment of the present invention.

Embodiments according to the present invention will now be explained with reference to the accompanying drawings.

An insulating film 2, such as a silicon oxide film or a silicon nitride film, is provided on the back side of a semiconductor substrate 1. To reach the back side of the semiconductor substrate 1 from the front side thereof, isolation regions 31, 32, 33 formed by embedding an insulating film in deep trench isolations (DTI) serving as isolation trenches are provided, thereby electrically isolating semiconductor regions 41, 42. Portions in the insulating film 2 each corresponding to the semiconductor region 41, 42 are selectively broken down and short-circuited to define an area for storing data for trimming in a non-volatile manner, which will be described in greater detail later.

The front side of the semiconductor substrate 1 is provided with circuit elements as described later, and a wiring layer 4 is further provided on the front sides thereof. The wiring layer 4 is provided with contacts 21, 22 each embedded with a conductive material in through-holes formed to expose the front sides of the semiconductor layers 41, 42. The contact 21 is coupled to a voltage applied terminal 11, while the contact 22 is coupled to a voltage applied terminal 12. In addition, a voltage applied terminal 13 is provided on the wiring layer 4, and coupled with a power supply 5 that supplies a predetermined voltage.

A switch SW1 and a resistor R1 connected in series are provided as circuit elements between the contact 21 and the voltage applied terminal 13 of the front surface of the semiconductor substrate 1, while a switch SW2 and a resistor R2 connected in series are provided between the contact 22 and the voltage applied terminal 13. The switches SW1, SW2 and the resistors R1, R2 may be configured by metal-oxide semiconductor field-effect transistors (MOSFET), for example. The switches SW1, SW2 receive signals for switching from a control terminal (not shown) to control ON/OFF operation.

A node N1 connecting the resistor R1 and the switch SW1 is connected to one input terminal of a selector circuit SR1 provided on the front surface of the semiconductor substrate 1. A node N2 connecting the resistor R2 and the switch SW2 is connected to the other input terminal of the selector circuit SR1.

Prior to trimming, the switches SW1, SW2 are in the ON state as shown in FIG. 1. The semiconductor substrate 1 is mounted with the insulating film 2 therebetween on a conductive layer 3, such as a frame, that is grounded and conductive.

Figure 2:
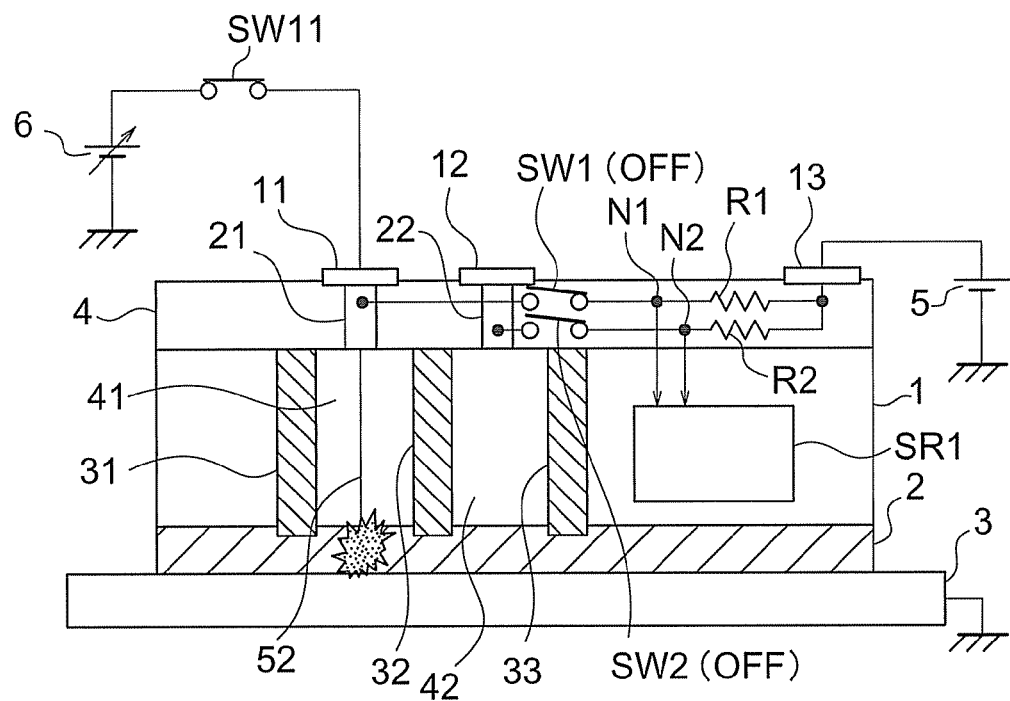
FIG. 2 is a sectional view of the semiconductor device that is subject to trimming.

FIG. 2 is a sectional view of the semiconductor device that is subject to trimming. First, the switches SW1, SW2 are turned OFF. Then, either the voltage applied terminal 11 or 12 (the voltage applied terminal 11 in this example) is selectively connected to a variable voltage power supply 6 via a switch SW11. Note that the variable voltage power supply 6 may be a power supply that outputs a fixed voltage.

Subsequently, with the switch SW11 being turned on, a power supply voltage is applied to the insulating film 2 through the voltage applied terminal 11, the contact 21, and the semiconductor layer 41, thereby causing insulation breakdown. As a consequence, a portion in between the contact 21 and the conductive layer 3 is grounded via a conduction path 52, resulting in a short circuit.

Figure 3:
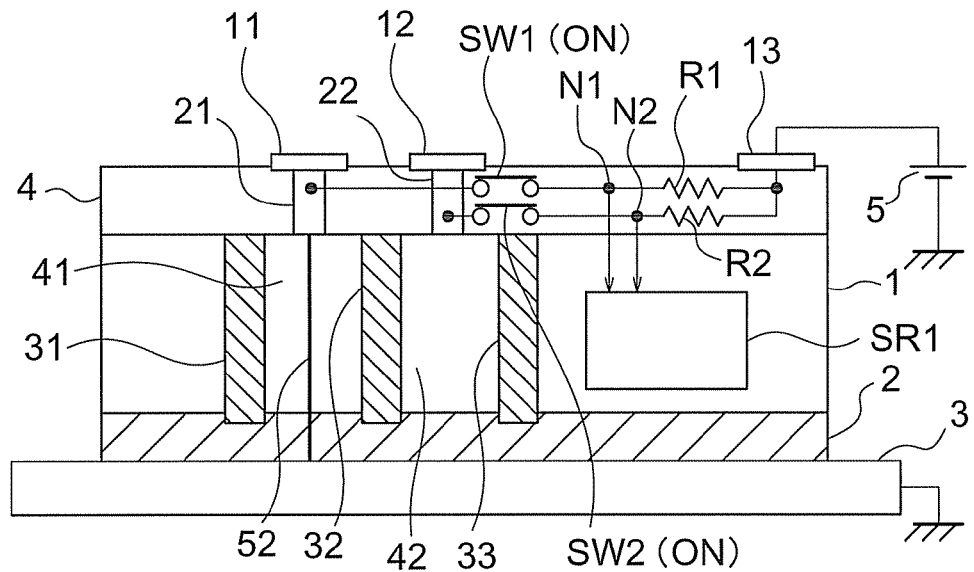
FIG. 3 is a sectional view of the semiconductor device after trimming.

FIG. 3 is a sectional view of the semiconductor device after trimming. The switches SW1, SW2 are turned ON after trimming.

The voltage applied terminal 11 and the contact 21 are grounded and short-circuited to the conductive layer 3 via the conduction path 52 between the semiconductor layer 41 and the insulating film 2. Consequently, a ground voltage is input to one input terminal of the selector circuit SR1 connected to the voltage applied terminal 11 via the contact 21, the switch SW1, and the node N1.

On the other hand, the other input terminal of the selector circuit SR1 connected to the voltage applied terminal 12 via the contact 22 and the switch SW2 receives a power supply voltage from the power supply 5. A combination of voltage values input to the selector circuit SR1 is determined accordingly. The selector circuit SR1 outputs a selection signal in accordance with the combination, and the signal is supplied to a power supply circuit or a redundant circuit (not shown) to perform predetermined selection.

The above-described process of trimming may be performed during a semiconductor wafer manufacturing process or after assembling a semiconductor chip. In either case, each chip region requires the voltage applied terminals 11, 12, 13, the switches SW1, SW2, and the selector circuit SR1.

The present embodiment requires no exclusive devices, namely, zener zaps occupying some area, on the wafer for trimming purposes, thereby preventing an increase in the circuit area.

While breaking down a zener zap requires large current, the present embodiment needs a voltage to be applied that is high enough to break down the insulating film 2, which is significantly smaller than the voltage required for breaking down a zener zap. This configuration leads to no restrictions on the layout that may affect other circuit elements, and thus enhances area efficiency. It should be noted that the thickness of the insulating film 2 is determined depending on pressure resistance levels required between adjacent semiconductor layers. For example, the insulating film 2 with a thickness of from 200 to 1000 angstroms can be broken down and short-circuited with a voltage of about 10 to 50 volts applied.

After breaking down the insulating film 2, the insulating film 2 is stably in the short-circuited state, so that it can input a stable value to the selector circuit.

The following paragraphs describe a technology for separating a semiconductor substrate into a plurality of semiconductor layers that are insulated electrically from each other by means of the DTI structure.

To lower a capacity between the drain of a transistor and a semiconductor substrate to achieve high-speed operation, silicon-on-insulator (SOI) substrates are widely used. Manufacturing an SOI substrate, however, requires complicated and costly processes including preparing two silicon substrates, bonding a silicon oxide film between the two substrates, and providing a silicon oxide film in the silicon substrates by ion implantation.

To address this problem, DTI is used to separate a semiconductor substrate into a plurality of semiconductor layers that are insulated electrically from each other as described below.

Figure 4:
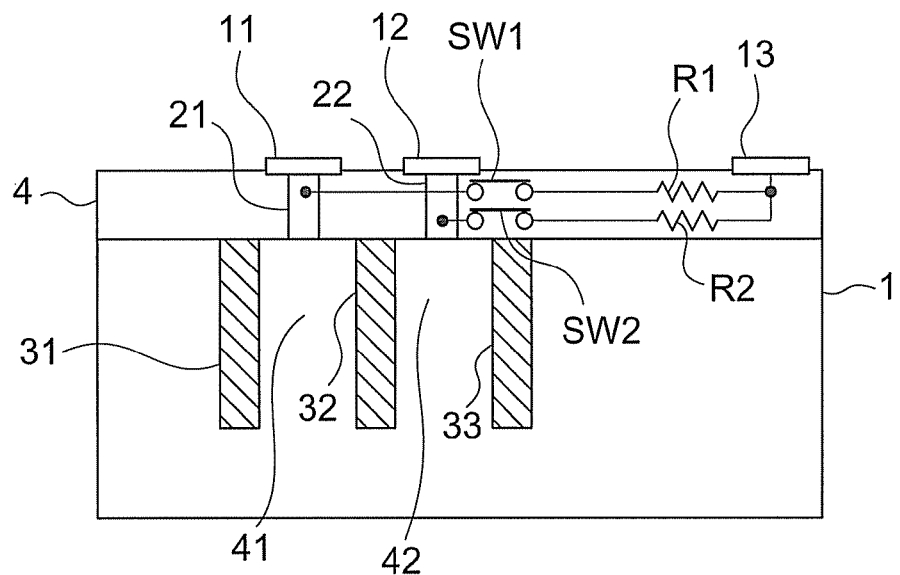
FIGS. 4 to 6 are sectional views showing steps of process, in which isolation regions having DTI structure are formed.

Referring to FIG. 4, the semiconductor substrate 1 having a predetermined thickness is prepared and the main surface thereof is provided with a deep trench. Then, an insulating film, such as a silicon oxide film, is embedded in the deep trench to provide the isolation regions 31, 32, 33 of the DTI structure. The isolation regions 31, 32, 33 define the semiconductor layers 41, 42. The front side of the semiconductor layers 41, 42 are provided with the switches SW1, SW2, the resistors R1, R2, the selector circuit (not shown) and other circuit elements, while the wiring layer 4 is further provided on the front sides thereof.

Figure 5:
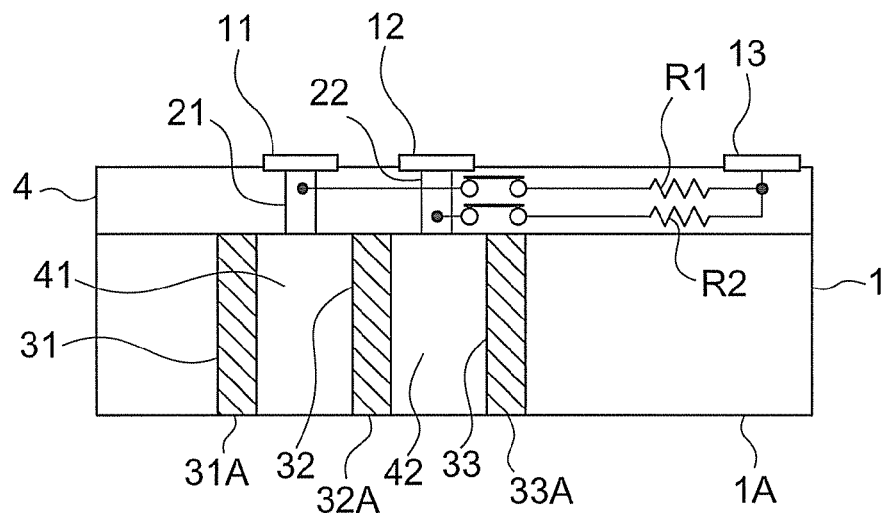

Referring next to FIG. 5, the back side 1A of the semiconductor substrate 1 is subject to polishing, e.g., chemical mechanical polishing (CMP), or etching to reduce the thickness until the bottom surfaces 31A, 32A, 33A of the isolation regions 31, 32, 33 are exposed.

Figure 6:
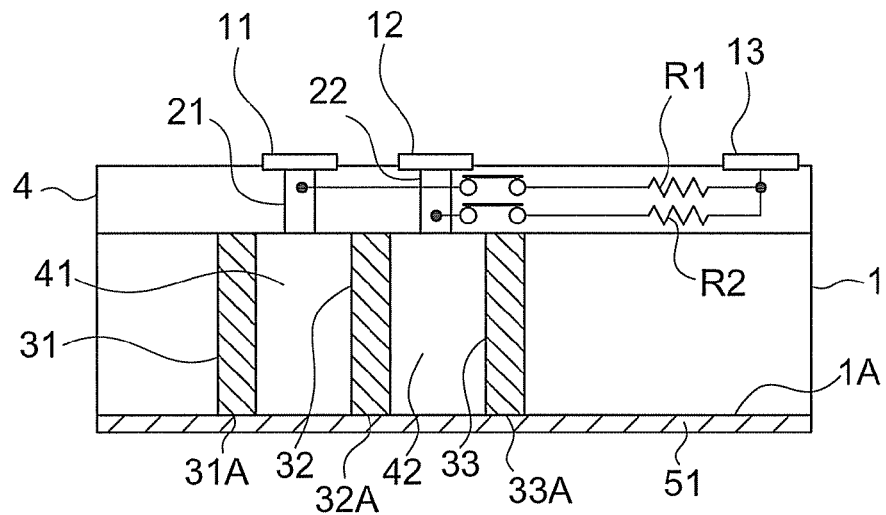

Referring now to FIG. 6, an insulating film 51 is provided on the back side 1A of the semiconductor substrate 1. Accordingly, the semiconductor layers 41, 42 are separated and insulated electrically from each other by means of the isolation regions 31, 32, 33 and the insulating film 51. Then, the conductive layer 3 is provided under the insulating film 51.

The insulating film 51 is provided to separate the semiconductor substrate into a plurality of semiconductor layers by means of the DTI structure, and is not provided for trimming purposes. Therefore, no additional step is required exclusively for trimming, which does not increase the number of steps in the manufacturing process.

The embodiments are described by way of example, and various modifications can be made within the spirit and scope of the present invention. For example, two semiconductor layers 41, 42 are separated and insulated electrically from each other and the insulating film 2 corresponding to each semiconductor layer 41, 42 is selectively broken down to input two-bit voltage values to the selector circuit SR1 for trimming in the above-described embodiments. Alternatively, trimming can be performed by separating and electrically insulating three or more semiconductor layers, selectively breaking down an insulating film corresponding to each of the layers, and inputting a voltage value of three bits or more.

Figure 7:
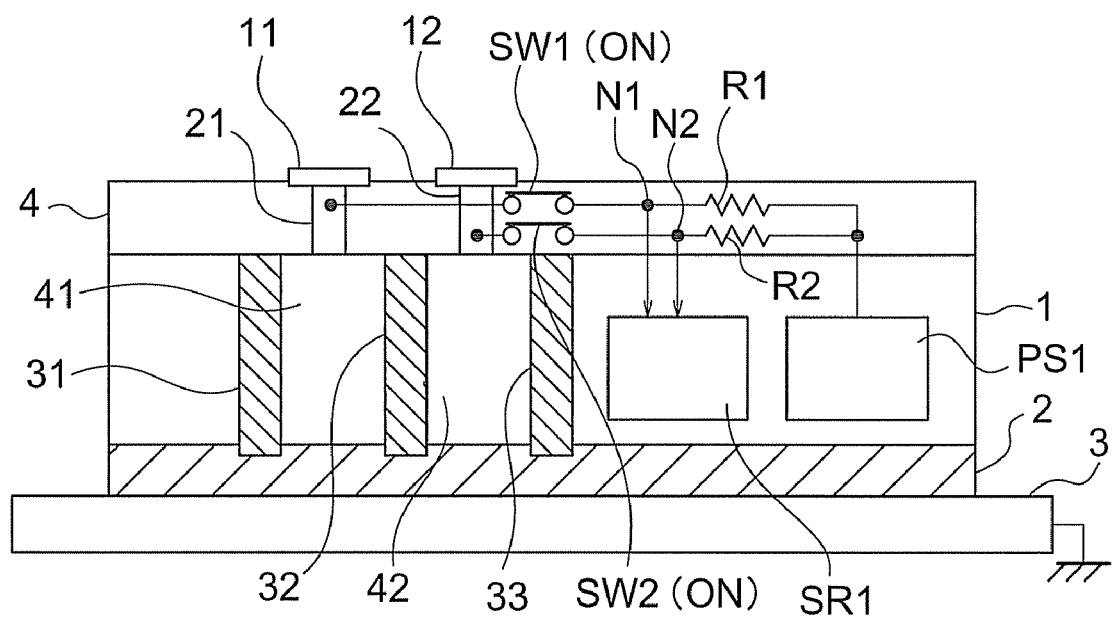
FIG. 7 is a sectional view of the semiconductor device before trimming according to another embodiment of the present invention.

While the voltage applied terminal 13 is provided on the wiring layer 4 and connected to the power supply 5 to supply a predetermined voltage in the above-described embodiments, the voltage applied terminal 13 is not necessarily required. For example, as a semiconductor device according to an alternative embodiment of the present invention illustrated in FIG. 7 shows, a built-in power supply circuit PS1 may supply a predetermined voltage to the nodes N1, N2 through the resistors R1, R2.

The invention claimed is:

1. A semiconductor device comprising:
    an insulating film provided on a back surface of a semiconductor substrate;
    a plurality of isolation regions provided to reach the insulating film from a main surface of the semiconductor substrate;
    at least a first semiconductor layer and a second semiconductor layer which are electrically insulated from each other by the isolation regions in the semiconductor substrate;
    a first voltage applied terminal electrically connected to a front surface of the first semiconductor layer;
    a second voltage applied terminal electrically connected to a front surface of the second semiconductor layer;
    a selector circuit receiving voltages from the first voltage applied terminal and the second voltage applied terminal, and supplying an output in accordance with a combination of the voltages; and
    a conductive layer provided so as to contact with the insulating film provided to the back side of the semiconductor substrate.

2. The semiconductor device according to claim 1, further comprising:
    a first switch connected in series between the first voltage applied terminal and a first node which is applicable with a predetermined voltage; and
    a second switch connected in series between the second voltage applied terminal and a second node which is applicable with the predetermined voltage.

3. The semiconductor device according to claim 2, further comprising:
    a third voltage applied terminal which is connected to the first node and the second node, wherein
    the third voltage is applicable with the predetermined voltage.

4. The semiconductor device according to claim 1, wherein each of the isolation regions is a deep trench isolation in which an insulating material is embedded in a deep trench.

5. The semiconductor device according to claim 3, wherein each of the isolation regions is a deep trench isolation in which an insulating material is embedded in a deep trench.

6. The semiconductor device according to claim 1, wherein the first voltage applied terminal is provided on a front surface of a wiring layer provided on the front surface of the semiconductor substrate, and is electrically connected to the front surface of the first semiconductor layer via a first contact provided in the wiring layer, and
    the second voltage applied terminal is provided on the front surface of the wiring layer, and is electrically connected to the front surface of the second semiconductor layer via a second contact provided in the wiring layer.

7. The semiconductor device according to claim 3, wherein the first voltage applied terminal is provided on a front surface of a wiring layer provided on the front surface of the semiconductor substrate, and is electrically connected to the front surface of the first semiconductor layer via a first contact provided in the wiring layer, and
    the second voltage applied terminal is provided on the front surface of the wiring layer, and is electrically connected to the front surface of the second semiconductor layer via a second contact provided in the wiring layer.

8. The semiconductor device according to claim 1, wherein the first switch and the second switch are MOSFET.

9. The semiconductor device according to claim 1, wherein the first and second switches are in a non-conductive state during trimming of the semiconductor device, and are in a conductive state after the trimming.

10. The semiconductor device according to claim 1, wherein in trimming of the semiconductor device, the first and the second switches are switched to a non-conductive state, and the first voltage applied terminal or the second voltage applied terminal is selectively applied with a voltage to short-circuit a portion between the semiconductor substrate and the first semiconductor layer or the second semiconductor layer.

11. The semiconductor device according to claim 1, wherein the insulating film has a thickness of 200 angstroms to 1000 angstroms.

12. A semiconductor device comprising:
an insulating film provided on a back surface of a semiconductor substrate;
a plurality of isolation regions provided to reach the insulating film from a main surface of the semiconductor substrate;
at least a first semiconductor layer and a second semiconductor layer which are electrically insulated from each other by the isolation regions in the semiconductor substrate;
a first voltage applied terminal electrically connected to a front surface of the first semiconductor layer;
a second voltage applied terminal electrically connected to a front surface of the second semiconductor layer;
a first switch connected in series between the first voltage applied terminal and a first node which is applicable with a predetermined voltage;
a second switch connected in series between the second voltage applied terminal and a second node which is applicable with the predetermined voltage;
a selector circuit receiving voltages from the first voltage applied terminal and the second voltage applied terminal, and supplying an output in accordance with a combination of the voltages;
a power supply circuit connected to the first node and the second node and applying a predetermined voltage, respectively; and
a conductive layer provided so as to contact with the insulating film provided to the back side of the semiconductor substrate.

13. The semiconductor device according to claim 12, wherein each of the isolation regions is a deep trench isolation in which an insulating material is embedded in a deep trench.

14. The semiconductor device according to claim 12, wherein the first voltage applied terminal is provided on a front surface of a wiring layer provided on the front surface of the semiconductor substrate, and is electrically connected to the front surface of the first semiconductor layer via a first contact provided in the wiring layer, and
the second voltage applied terminal is provided on the front surface of the wiring layer, and is electrically connected to the front surface of the second semiconductor layer via a second contact provided in the wiring layer.

15. The semiconductor device according to claim 13, wherein the first voltage applied terminal is provided on a front surface of a wiring layer provided on the front surface of the semiconductor substrate, and is electrically connected to the front surface of the first semiconductor layer via a first contact provided in the wiring layer, and
the second voltage applied terminal is provided on the front surface of the wiring layer, and is electrically connected to the front surface of the second semiconductor layer via a second contact provided in the wiring layer.

16. The semiconductor device according to claim 12, wherein the first switch and the second switch are MOSFET.

17. The semiconductor device according to claim 12, wherein the first and second switches are in a non-conductive state during trimming of the semiconductor device, and are in a conductive state after the trimming.

18. The semiconductor device according to claim 12, wherein in trimming of the semiconductor device, the first and the second switches are switched to a non-conductive state, and the first voltage applied terminal or the second voltage applied terminal is selectively applied with a voltage to short-circuit a portion between the semiconductor substrate and the first semiconductor layer or the second semiconductor layer.

19. A method for manufacturing a semiconductor device, the method comprising:
forming a plurality of deep trench isolations on a main surface of a semiconductor substrate by embedding an insulating material in deep trenches;
providing, on the semiconductor substrate, a first voltage applied terminal electrically connected to a front surface of a first semiconductor layer provided between two of the deep trench isolations which are adjacent to each other, a second voltage applied terminal electrically connected to a front surface of a second semiconductor layer provided between other two of the deep trench isolations which are adjacent to each other, and a selector circuit which receives voltages from the first voltage applied terminal and the second voltage applied terminal and supplies an output in accordance with a combination of the voltages;
polishing a back surface of the semiconductor substrate until the plurality of deep trench isolations are exposed on the back surface of the semiconductor substrate;
providing an insulating film on the back surface of the semiconductor substrate; and
providing a conductive layer under the insulating film.

20. The method according to claim 19, wherein the insulating film has a thickness of 200 angstroms to 1000 angstroms.

* * * * *